(12) United States Patent
Besseling et al.

(10) Patent No.: US 12,060,296 B2
(45) Date of Patent: *Aug. 13, 2024

(54) COATING AND COATING FORMULATION

(71) Applicant: Covestro (Netherlands) B.V., Nieuwegein (NL)

(72) Inventors: Thijs Besseling, Echt (NL); Peter Leonardus Elisabeth Maria Pasmans, Echt (NL); Guy Draaisma, Echt (NL)

(73) Assignee: Covestro (Netherlands) B.V., Geleen (NL)

( * ) Notice: Subject to any disclaimer, the term of this patent is extended or adjusted under 35 U.S.C. 154(b) by 637 days.

This patent is subject to a terminal disclaimer.

(21) Appl. No.: 17/279,802

(22) PCT Filed: Oct. 15, 2019

(86) PCT No.: PCT/EP2019/077870
§ 371 (c)(1),
(2) Date: Mar. 25, 2021

(87) PCT Pub. No.: WO2020/078951
PCT Pub. Date: Apr. 23, 2020

(65) Prior Publication Data
US 2021/0317034 A1   Oct. 14, 2021

(30) Foreign Application Priority Data

Oct. 16, 2018   (EP) ..................................... 18200813
Oct. 16, 2018   (EP) ..................................... 18200816

(51) Int. Cl.
C03C 17/34   (2006.01)
B82Y 20/00   (2011.01)
(Continued)

(52) U.S. Cl.
CPC ........... *C03C 17/3411* (2013.01); *B82Y 20/00* (2013.01); *B82Y 30/00* (2013.01); *B82Y 40/00* (2013.01);
(Continued)

(58) Field of Classification Search
CPC .......... C03C 2217/425; C03C 2217/45; C03C 2217/475; C03C 2217/48;
(Continued)

(56) References Cited

U.S. PATENT DOCUMENTS

2009/0205536 A1   8/2009   Chiang et al.
2010/0165467 A1   7/2010   Thies
(Continued)

FOREIGN PATENT DOCUMENTS

EP   2752386 A1   7/2014

OTHER PUBLICATIONS

International Search Report and Written Opinion dated Dec. 13, 2019.
(Continued)

*Primary Examiner* — Mustak Choudhury
(74) *Attorney, Agent, or Firm* — The Webb Law Firm

(57) ABSTRACT

A coated substrate comprising a coating layer comprising inorganic oxide and pores, the coating layer demonstrates improved durability properties. The coated substrate may for example be used in solar modules. Further a coating formulation and use of the coating formulation are disclosed.

16 Claims, 1 Drawing Sheet

(51) Int. Cl.
*B82Y 30/00* (2011.01)
*B82Y 40/00* (2011.01)
*H01L 31/048* (2014.01)

(52) U.S. Cl.
CPC .... *C03C 2217/425* (2013.01); *C03C 2217/45* (2013.01); *C03C 2217/475* (2013.01); *C03C 2217/48* (2013.01); *C03C 2217/734* (2013.01); *H01L 31/0481* (2013.01)

(58) Field of Classification Search
CPC ........... C03C 2217/734; C03C 17/3411; C03C 2218/365; B82Y 20/00; B82Y 30/00; B82Y 40/00; H01L 31/0481
See application file for complete search history.

(56) References Cited

U.S. PATENT DOCUMENTS

| | | |
|---|---|---|
| 2010/0249297 A1 | 9/2010 | Thies et al. |
| 2013/0065064 A1* | 3/2013 | Sharma ................... C09D 5/02 428/447 |
| 2013/0163087 A1 | 6/2013 | Lecolley et al. |
| 2013/0183489 A1 | 7/2013 | Cremer |
| 2013/0194668 A1 | 8/2013 | Liang |
| 2013/0202895 A1 | 8/2013 | Arfsten et al. |
| 2013/0276880 A1* | 10/2013 | Wolff ..................... C03C 3/068 438/69 |
| 2014/0009834 A1 | 1/2014 | Kalyankar |
| 2014/0030429 A1 | 1/2014 | Aben et al. |
| 2014/0170308 A1 | 6/2014 | Kalyankar |
| 2014/0186613 A1* | 7/2014 | Liang ................... C03C 17/007 428/328 |
| 2014/0356633 A1 | 12/2014 | Liang |
| 2015/0059846 A1 | 3/2015 | Shiraishi et al. |
| 2016/0291206 A1 | 10/2016 | Van Dijck et al. |
| 2018/0346734 A1 | 12/2018 | Stollwerck et al. |
| 2020/0123391 A1 | 4/2020 | Habets et al. |

OTHER PUBLICATIONS

Zhang, et al., "Multifunctional Antireflection Coatings Based on Novel Hollow Silica-Silica Nanocomposites," ACS Applied Materials & Interfaces, 2014, vol. 6, pp. 1415-1423.

* cited by examiner

Figure 1
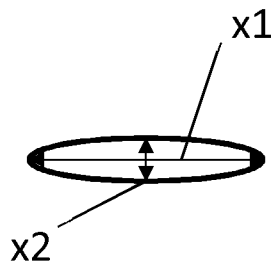
Fig. 1a
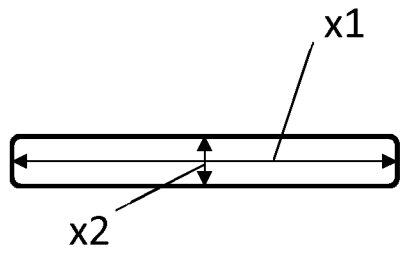
Fig. 1b
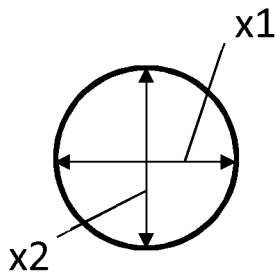
Fig. 1c
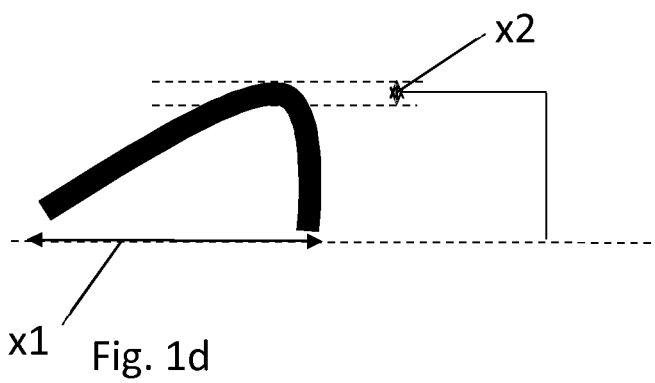
Fig. 1d
Figure 2
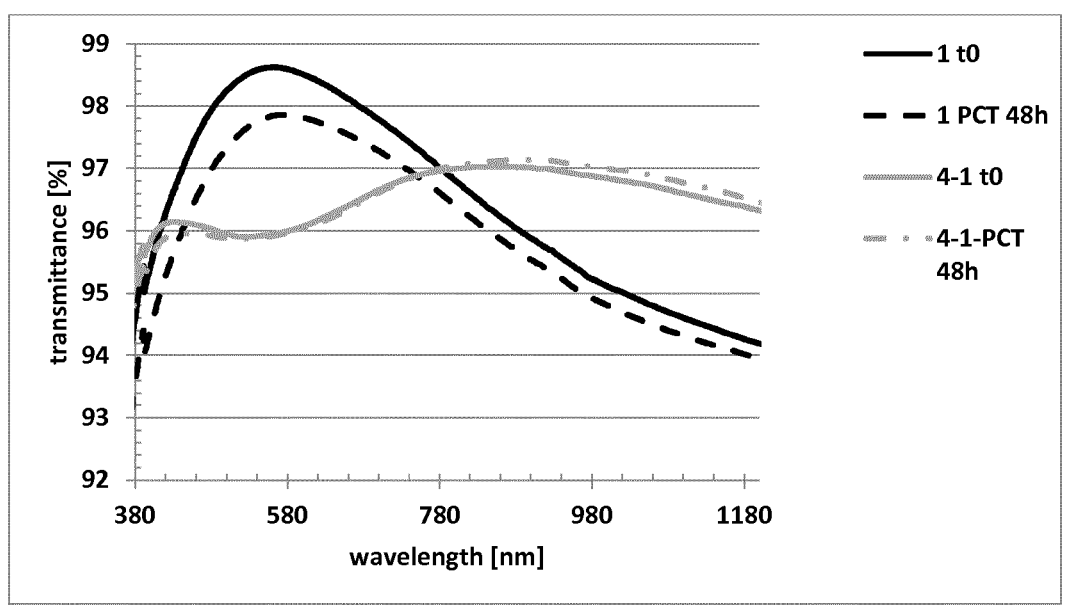

COATING AND COATING FORMULATION

CROSS-REFERENCE TO RELATED APPLICATIONS

This application is a U.S. national phase entry under 35 USC 371 of international application PCT/EP2019/077870, filed 15 Oct. 2019, which designated the EP and claims priority to European Patent Application EP 18200813.6, filed 16 Oct. 2018 and European Patent Application 18200816.9, filed 16 Oct. 2018, the entire contents of each of which is hereby incorporated by reference in its entirety.

TECHNICAL FIELD OF THE INVENTION

The invention relates to an anti-reflective coating. More particularly, the invention relates to an anti-reflective coating showing improved durability properties as well as a coated substrate, a kit of parts for providing an antireflective coating having an improved property on a cover glass for use in a solar module and a solar module, as well as a method of preparing a coated substrate.

A coated substrate comprising a coating layer, said layer comprising inorganic oxide and pores is disclosed herein, the coating layer demonstrates improved durability properties. The coated substrate may for example be used in solar modules. Further a kit of parts for providing an antireflective coating having an improved property on a cover glass for use in a solar module and use of such kit are disclosed.

BACKGROUND OF THE INVENTION

Anti-reflective (AR) coatings are coatings deposited on substrates, which require high transmission of light such as cover glasses for solar modules and green house glass, and said coatings are able to reduce the reflectivity of said substrates. Performance of solar modules tend to decrease over time amongst other reasons also due to exposure of the surface where light is transmitted through to temperate and/or humidity conditions which may changes significantly during the day and night, and/or during seasons depending on the local circumstances.

OBJECTS OF THE INVENTION

It is the object of the invention to provide an improved coating.

In another aspect of the invention, it is an object of the invention to provide a kit of parts for providing an antireflective coating having an improved property on a cover glass for use in a solar module In a further aspect of the invention, it is an object of the invention to provide a method of improving durability properties of a coating.

The improvement may for example be achieving of improved durability properties of the coating, or another feature of the invention.

DISCLOSURE OF THE INVENTION

In an aspect of the invention, the object is achieved by a kit according to the claims, embodiments and aspects as described herein.

In further aspects of the invention, the objective is achieved by a method, a coated substrate, or a use according to the claims, embodiments and aspects as described herein.

BRIEF DESCRIPTION OF THE DRAWINGS

The invention is explained below with reference to exemplary embodiments as well as the drawings, in which FIG. 1a schematically depicts an embodiment of an elongated particle used in the invention with an ellipsoidal shape (2D image of an prolate (elongated) spheroid), having a longer (which may also be referred to as major) axis having a length x1 perpendicular; a shorter (which may also be referred to as minor) axis perpendicular to the longer axis having a length x2; and an aspect ratio (x1/x2) of at least two.

FIG. 1b schematically depicts an embodiment of an elongated particle used in the invention with a rod-like shape, having
a longer axis a having length x1; a shorter axis (smaller diameter) perpendicular to the longer axis having a length x2; and an aspect ratio (x1/x2) of at least two.

FIG. 1c schematically depicts a spherical particle, having a first axis having a length x1;
a second axis perpendicular to the first axis having a length x2; and an aspect ratio (x1/x2) of about 1.

FIG. 1d schematically depicts an embodiment of an elongated particle used in the invention having an irregular shape, having
a longer axis having a length x1; a shorter axis (smaller diameter, shortest dimension of the particle) perpendicular to the longer axis having a length x2 (the length of the longest straight line from one side of the particle to the other side of the particle); and an aspect ratio (x1/x2) of at least two.

FIG. 2 shows the change in transmission after PCT 48 h.

DETAILED DESCRIPTION

The invention relates to an improved coating.

Such improved coating may be obtained by converting a coating formulation into a functional coating for example by heating. The invention thus also relates to an improved coated substrate.

Typically, by converting the coating formulation on a substrate into a coated substrate.

The invention also relates to a kit of parts for providing an antireflective coating having an improved property on a cover glass for use in a solar module.

The durability of a solar panel is an important property of such panel.

The durability of an anti-reflective (AR) coated solar cover glass may be tested using a so called Pressure cooker test (PCT). The purpose of the PCT is to accelerate moisture penetration into the coated and/or uncoated glass by raising the water vapor pressure inside the test chamber to a level that is drastically higher than the water vapor pressure inside the testing specimen and then to evaluate the resistance of coated/uncoated glass to humidity and high pressure environments. This is to mimic outdoor conditions in an accelerated way.

The Hirayama chamber PC-422R8 Pressure Cooker Test (PCT), also known as an autoclave test, is a highly-accelerated temperature and humidity stress test and uses temperature and humidity as stress factors, the test is derived from JESD22A102 standard from the electronics industry and is commonly adopted by the solar industry.

The standard test conditions are obtained by placing a test specimen in a climate chamber set at a temperature of 121° C.±2° C. at a relative humidity of 100% RH±5% RH resulting in an absolute pressure of about 2 bar for 24 hours (unless otherwise mentioned). Alternatively, the duration of the PCT test may be 48 hours A PCT test may be used in the solar industry to assess the durability of a substrate, in particular a coated substrate, as follows:

The average transmission of a coated substrate is measured in the wavelength range from 380 to 1100 nm using a spectrophotometer (T % (380-1100 nm)). After that the PCT test is performed. After the PCT test the average transmission of the same coated substrate is measured again in same wavelength range and the ΔT % (380-1100 nm) is calculated.

$\Delta T\% (380\text{-}1100 \text{ nm})_{PCT}$=average transmission 380-1100 nm before PCT test minus average transmission 380-1100 nm after PCT test as the sample substrate=$T\%$ (380-1100 nm)$_{before\ PCT}$−$T\%$ (380-1100 nm)$_{after\ PCT}$ In an aspect a $\Delta T \%$ (380-1100 nm)$_{PCT48\ hours}$ of a substrate of less than 0.2% indicates a good durability.

Herein the average transmittance from 380-1100 nm means the average transmittance value in the wavelength range of 380 to 1100 nm. In an aspect the transmittance is measured using an Optosol Transpec VIS-NIR spectrophotometer equipped with an integrating sphere. In an aspect the transmittance is measured using a Shimadzu UV2600 spectrophotometer.

A container, herein is a reservoir or tank that can comprise or retain a substance such as a coating formulation. Typically the container is used for storing or transporting liquids, such as coating formulation, which in the context of the present invention is a liquid. Suitable examples of a container include a bottle, a can, a drum. It is preferably made of plastic such as polyolefin The coating formulation according to the invention provides improved durability properties. The combined use of the first and second coating formulation according to the invention provides improved durability properties to a coating obtained from it.

These improved durability properties are obtained from such formulations after curing i.e. by converting the coating formulation on a substrate into a coated substrate for example by heating, such as by heating above 400 degrees Celsius.

The method according to the invention provides a coated substrate demonstrating improved durability properties.

The present invention relates to a kit of parts for providing an antireflective coating having an improved property on a cover glass for use in a solar module, comprising
(a) A first container comprising a first coating formulation comprising an inorganic oxide binder and a solvent; and
(b) A second container comprising a second coating formulation comprising
  i. at least 2 wt-% based on inorganic oxide equivalents of elongated dense inorganic oxide particles with an aspect ratio of at least 2 and an average smaller diameter in the range of 3 to 20 nm;
  ii. a porogen capable of forming pores with a diameter in the range of 10 to 120 nm;
  iii. an inorganic oxide binder; and
  iv. a solvent,
    wherein the second coating formulation comprises 0 to 30 wt-% aluminium oxide equivalents of aluminium containing compound, based on total ash rest after combustion at 600° C., 2 min in air.

The average smaller diameter as referred to herein may be measured from at least one TEM image.

The aspect ratio as referred to herein may be determined from at least one TEM image.

The amount of aluminium oxide equivalents of aluminium containing compound in the ash rest of the coating formulation as referred to herein may be determined via ICP-MS.

The first coating formulation comprises an inorganic oxide binder as described herein. The binder comprises inorganic binder particles, such as metaloxide particles, and/or an inorganic oxide precursor. The first coating formulation comprises a solvent as described herein.

In an aspect of the invention the second coating formulation comprises at least 2 wt-%, at least 3 wt %, at least 4 wt %, at least 5 wt %, at least 6 wt %, at least 7 wt %, at least 8 wt %, at least 9 wt %, at least 10 wt %, at least 11 wt %, at least 12 wt %, at least 13 wt %, at least 14 wt %, at least 15 wt % or at least 16 wt % based on inorganic oxide equivalents of elongated dense inorganic oxide particles with an aspect ratio of at least 2 and a smaller diameter in the range of 3 to 20 nm.

In an aspect of the invention the second coating formulation comprises at least 17 wt-%, at least 18 wt %, at least 19 wt %, at least 20 wt %, at least 22 wt %, at least 25 wt % based on inorganic oxide equivalents of elongated dense inorganic oxide particles with an aspect ratio of at least 2 and a smaller diameter in the range of 3 to 20 nm.

In an aspect of the invention the second coating formulation comprises at most 30 wt %, at most 28 wt %, at most 26 wt %, at most 25 wt %, at most 22 wt %, at most 20 wt %, at most 18 wt % at most 15 wt % based on inorganic oxide equivalents of elongated dense inorganic oxide particles with an aspect ratio of at least 2 and a smaller diameter in the range of 3 to 20 nm.

The wt % of elongated dense inorganic oxide particles with an aspect ratio of at least 2 and an average smaller diameter in the range of 3 to 20 nm based on inorganic oxide equivalents (wt % elongated particles) may be calculated as follows.

The wt % elongated particles=the wt % inorganic oxide equivalents originating from elongated particles as compared to the total amount of silicon oxide equivalents in the coating formulation=m (SiO$_2$ elongated particles)/m (SiO$_2$ total)*100=wt % elongated particles=wt % of elongated dense inorganic oxide particles with an aspect ratio of at least 2 and an average smaller diameter in the range of 3 to 20 nm based on inorganic oxide equivalents. With m is gram of solids of elongated particles.

In an aspect of the invention the second coating formulation comprises between 0.1 to 30 wt-% aluminium oxide equivalents of aluminium containing compound. In an aspect of the invention the second coating formulation comprises between 0.5 to 30 wt-% aluminium oxide·equivalents of aluminium containing compound. In an aspect of the invention the coating formulation comprises between 0.5 to 25 wt-% aluminium oxide equivalents of aluminium containing compound, comprises between 1.0 to 25 wt-% aluminium oxide equivalents of aluminium containing compound, between 2.0 and 20 wt % aluminium oxide equivalents of aluminium containing compound.

In an aspect of the invention the second coating formulation comprises at least 0.1 wt %, at least 0.5 wt %, at least 1 wt %, at least 2 wt %, at least 3 wt %, at least 5 wt %, at least 7 wt % at least 10 wt %, at least 12 wt % aluminium oxide equivalents of aluminium containing compound.

In an aspect of the invention the second coating formulation comprises 30 wt % or less, 25 wt % or less, 22 wt % or less, 20 wt % or less, 18 wt % or less, 14 wt % or less aluminium oxide equivalents of aluminium containing compound.

The invention further provides method of preparing a coated substrate comprising the steps of:
a) providing a substrate having a first surface;
b) applying a first coating formulation as defined in any one of the preceding embodiments on the first surface of the substrate;
c) drying the applied first coating formulation to obtain the substrate comprising an at least partially covered first surface;
d) applying a second coating formulation as defined in any one of the preceding embodiments on the at least partially covered first surface;
e) optionally drying of the applied second coating formulation; and
f) converting the substrate into a coated substrate.

This way a coated substrate comprising a substrate and an anti-reflective coating provided on a surface of the substrate is obtained.

The anti-reflective coating comprises a first coating layer provided on the surface of the substrate, a second coating layer contacting a surface of the first layer at a side opposite to the substrate.

In an aspect the substrate is having an average transmission of at least 80% in the range of 380-1100 nm.

The coated substrate according to the invention comprising at least two coating layers on the first surface. As shown for example by electron microscopy such SEM or TEM. Ellipsometry may be used as an alternative to determine the presence of two layers.

First reflection measurement may be used as an alternative to determine the presence of two layers.

Transmission measurements may be used as an alternative to determine the presence of two layers.

The coated substrate according to the invention typically comprises at least two applied coating layers on the first surface.

The skilled person knows how to dry the applied coating in step c) to ensure it is strong enough to withstand the conditions of applying the second coating formulation. Suitable drying conditions may include exposing the first coating formulation on the first surface of the substrate to a temperature of 90-300° C. for 10 second to 7 minutes.

The skilled person knows how to vary time and temperature to ensure the applied first coating formulation is strong enough to withstand the conditions of applying the second coating formulation. For example 5-7 min at 90° C. before the second coating formulation is applied. Or for example less than 1 minute at 200-300° C.

In an aspect of the method according to the invention after drying the applied first coating formulation and before applying the second coating formulation on the at least partially coated first surface of the coated substrate, the substrate comprising the dried first coating formulation is cooled to temperature in the range of 20 to 40° C.

In an aspect of the method according to the invention, in step c) drying occurs by exposing the first coating formulation on the first surface of the substrate to a temperature of 90-300° C. for 10 second to 5 minutes.

In an aspect of the method according to the invention, in step f) converting occurs via heating, such as by heating above 400 degrees Celsius, preferably for at least 1 minute.

In further aspect of the invention, the objective is achieved by a method of preparing a coated substrate comprising the steps of:

a) providing a substrate having a first surface;
b) providing a first coating formulation as defined in any one of the disclosed embodiments;
c) applying the first coating formulation on the first surface of the substrate;
d) drying the applied first coating formulation to obtain the substrate comprising an at least partially coated first surface;
e) cooling the coated substrate, see comment box,
f) providing a second coating formulation as defined in any one of the disclosed embodiments;
g) applying the second coating formulation on the at least partially coated first surface of the coated substrate;
h) Drying of the applied second coating, preferably at ambient temperature, such as 18-35 degrees Celsius;
i) converting the substrate comprising an at least partially further coated first surface into a coated substrate comprising at least two coating layers on the first surface, for example by heating, such as by heating above 400 degrees Celsius.

The second coating formulation described herein comprises elongated dense inorganic oxide particles with an aspect ratio of at least 2, and a smaller diameter in the range of 3 to 20 nm in a coating on a substrate. It was found that applying a first coating layer underneath the second coating layer comprising such elongated particles resulted in improved durability of the coated substrate obtained with the method.

It was found that applying a first coating layer underneath the second coating layer comprising such elongated particles resulted in improved mechanical stability of the coated substrate obtained with the method.

In a further aspect of the invention, the objective is achieved by a coated substrate obtainable by a method as described herein.

The present invention further relates to a coated substrate, comprising a substrate, and an anti-reflective coating provided on a surface of the substrate,
wherein the anti-reflective coating comprises a first coating layer provided on the surface of the substrate, a second coating layer contacting a surface of the first layer at a side opposite to the substrate, wherein the first layer comprises:
an inorganic oxide binder; and
and wherein the second layer comprises:
elongated dense inorganic oxide particles with an aspect ratio of at least 2 and a smaller diameter in the range of 3 to 20 nm;
0 to 30 wt-% aluminium oxide equivalents of aluminium containing compound;
an inorganic oxide binder; and
pores with a diameter in the range of 10 to 120 nm as measured using ellipsometry and/or electron microscopy.

In an aspect the substrate is having an average transmission of at least 80% in the range of 380-1100 nm.

The second coating layer described herein comprises elongated dense inorganic oxide particles with an aspect ratio of at least 2, and a smaller diameter in the range of 3 to 20 nm in a coating on a substrate. It was found that applying a first coating layer underneath the second coating layer comprising such elongated particles resulted in improved durability of the coated substrate.

The present invention further relates to a coated substrate, comprising a substrate, and an anti-reflective coating provided on a surface of the substrate,
wherein the anti-reflective coating comprises a first coating layer provided on the surface of the substrate, a second coating layer contacting a surface of the first layer at a side opposite to the substrate, wherein the first layer comprises:

an inorganic oxide binder; and and wherein the second layer comprises:

elongated dense inorganic oxide particles with an aspect ratio of at least 2 and a smaller diameter in the range of 3 to 20 nm;

0 to 30 wt-% aluminium oxide equivalents of aluminium containing compound;

an inorganic oxide binder; and pores with a diameter in the range of 10 to 120 nm as measured using ellipsometry and/or electron microscopy The wt-% aluminium oxide equivalents of aluminium containing compound in the antireflective coating may be determined using STEM EDX. Alternatively it may be determined using ToF-SIMS.

In an aspect of the invention the polymer may be a cationic polymer.

In an embodiment of the coated substrate according to the invention the substrate is a glass substrate having a refractive index $n0$;

the first layer has a first layer thickness in the range from 50 to 180 nm, as measured using ellipsometry, and a refractive index $n1$ at an optical wavelength of 600 nm in the range of 1.50-1.30 as measured using ellipsometry on a coated substrate; and the second layer has a second layer thickness in the range from 50 to 180 nm, as measured using ellipsometry, and a refractive index $n2$ at an optical wavelength of 600 nm in the range of 1.35-1.20 as measured using ellipsometry on a coated substrate.

and $n0 < n1 < n2$

A benefit is that such coated substrate may have a neutral color. A neutral colour is defined as a coated substrate that demonstrates a $\Delta E^*$ of less than 2.3 with respect to the gray axis, defined by $a1^* = b1^* = 0$ and $L1^*$ between 0 and 100, which effectively results in the definition $\Delta E^* = (a2^{*2} + b2^{*2})^{1/2} < 2.3$, wherein $\Delta E^*$, $L^*$, $a^*$ and $b^*$ are defined according to CIELAB values, using the CIE76 standard with a D65 illuminant and $L2^*$, $a2^*$ and $b2^*$ are calculated using a total reflection measurement of the coated substrate.

In an embodiment the $\Delta E^*$ is measured using the ISO 11664-4:2008 (which refers to the CIE 1976 L*a*b* Colour space) on the coated side of the substrate.

The coating disclosed herein is a porous coating. The coating may be manufactured using a coating formulation comprising a binder and a porogen. The binder comprises inorganic binder particles, such as metaloxide particles, and/or an inorganic oxide precursor. The porogen typically comprises an organic material that will decompose, burn, evaporate or be otherwise removed upon exposure to elevated temperature. Typically the elevated temperature is 400 degrees Celcius or more, such as 550 degrees Celsius or more, such as 600 degrees Celsius or more. Typically the organic material is an organic polymer. In an aspect porogen comprises an organic material comprising an organic polymer such as an organic neutral, an organic cationic an organic anionic polymer, an polyelectrolytes or a combination thereof. The porogen typically comprises an organic polymer core and an inorganic oxide shell around the core. wt % organic porogen material may be defined as $$\text{wt \% organic porogen material} = \frac{\text{weight [organic porogen material]}}{\text{weight [organic porogen material] +}} * 100$$
$$\text{weight [total amount of inorganics]}$$

The wt % organic porogen material is typically expressed as a fraction of the non-volatile organic material of the total amount of solids in the coating formulation. The wt % organic porogen material may be determined as follows:

a) Weigh an amount of the formulation.

b) Thereafter dry the formulation to constant mass such that all volatile components are removed. For example, by drying at 200° C. under vacuum until there is no further mass loss observed.

c) Weigh the remaining material. This is the weight of solids (total mass organic porogen material and inorganics).

d) Heat the remainder of solids for 10 min at 650° C.

e) Weigh the remainder. This is the weight of inorganics.

f) Calculate the difference between the weight of solids and the weight of inorganics: this is the weight of organic porogen material.

g) Apply the following formula:

$$\text{wt \% organic porogen material} = \frac{\text{weight [organic porogen material]}}{\text{weight [organic porogen material] +}} * 100$$
$$\text{weight [total amount of inorganics]}$$

Solids is the amount of non volatile organic material plus inorganic material.

The coating according to the disclosure comprises inorganic particles such as elongated inorganic dense oxide particles. It is noted that elongated inorganic dense oxide particles and elongated dense inorganic oxide particles are used interchangeably herein. It is noted that elongated inorganic dense oxide particles and elongated massive metal oxide particles are used interchangeably herein.

In another aspect, the elongated dense inorganic oxide particles account for a significant amount of the inorganic oxide in the second coating layer.

The second coating formulation comprises elongated dense inorganic oxide particles with an aspect ratio of at least 2, and a smaller diameter in the range of 3 to 20 nm in a coating on a substrate. It was found that the presence of the first coating layer underneath the second coating layer comprising such elongated particles resulted in improved durability of the anti-reflective coating.

In another aspect, the elongated dense inorganic oxide particles account for a significant amount of the inorganic oxide in the second coating formulation.

In an aspect of the second coating formulation according to the invention the elongated dense inorganic oxide particles accounts for 5 to 70 wt-% of the total amount of inorganic oxide equivalents in the coating formulation, preferably for 5 to 50 wt-% of the total amount of inorganic oxide equivalents in the second coating formulation, more preferably for 10 to 45 wt-% of the total amount of inorganic oxide equivalents in the second coating formulation, and most preferably for 12 to 30 wt-% of the total amount of inorganic oxide equivalents in the coating formulation. In an aspect of the second coating formulation according to the invention the elongated dense inorganic oxide particles accounts for 5 to 15 wt-% of the total amount of inorganic oxide equivalents in the coating formulation.

In an aspect of the second coating formulation according to the invention the elongated dense inorganic oxide particles accounts for at least 5 wt %, at least 7 wt %, 8 wt %, at least 9 wt %, at least 10 wt %, at least 11 wt %, at least 12 wt %, at least 13 wt %, at least 14 wt %, at least 15 wt %, at least 16 wt %, at least 17 wt-%, at least 18 wt %, at least 19 wt %, at least 20 wt %, at least 22 wt %, at least 25 wt based of the total amount of inorganic oxide equivalents in the second coating formulation.

In an aspect of the second coating formulation according to the invention the elongated dense inorganic oxide particles accounts for 30 wt % or less, 28 wt % or less, 26 wt % or less, 25 wt % or less, 22 wt % or less, 20 wt % or less, 18 wt % or less or 15 wt % or less of the total amount of inorganic oxide equivalents in the second coating formulation.

The anti-reflective coating according to the invention comprises pores with a diameter in the range of less than 1 nm up to about 120 nm. The pores may be open pores, such as an opening along a boundary between two particles and optionally connecting to the surface of the coating, and/or the pores may be closed, such as a (closed) hollow particle. Pores that originate from a porogen are also referred to herein as porogen pores. It is preferred that the coating comprises pores with a diameter of 10 to 120 nm, referred to as porogen pores. For pores with a diameter of more than 10 nm, the pore diameter can be estimated by electron microscopy. For pores with a diameter in the range from 2 to 50 nm, porosimetry ellipsometry can be used to determine the pore size distribution.

Porogen pores are preferably of substantially regular shape, such as spherical or ellipsoidal (with one or two long axes) pores. In an aspect, porogen pores are preferably of substantially regular shape, such as spherical or ellipsoidal (with one or two long axes) pores, but should not have an aspect ratio of more than 5 as this may negatively influence the mechanical properties of the coating. A hollow particle, such as an hollow inorganic oxide particle may be defined as a particle with an inorganic oxide shell with a hollow core. Porogen pores may be defined by a hollow inorganic oxide particle, such as for example hollow inorganic oxide particles and may originate from core-shell particles having an inorganic oxide (or inorganic oxide precursor) shell and an organic polymer based core, so that upon curing of the coating the polymer will be removed. Upon curing of the coating formulation the polymer will be decomposed/removed and the coating is formed. Porogen pores may be defined by a hollow inorganic oxide particle, such as for example hollow inorganic oxide particles and may originate from core-shell particles having an inorganic oxide (or inorganic oxide precursor) shell and a core material comprising an organic polymer and/or an organic compound, so that upon curing of the coating the core material will be removed. Upon curing of the coating formulation the core material will be decomposed/removed such that a porous coating is formed. The pore typically originates from an organic porogen, that during conversion of the coating formulation into a functional coating typically will be decomposed, burned, evaporated or otherwise removed.

In an aspect a suitable curing temperature is at least 400 degrees Celsius. In an aspect a suitable curing temperature is at least 550, in an aspect at least degrees 600 Celsius. Pores may also be defined by a combination of inorganic binder particles and/or dense inorganic oxide particles. In this case, the pore typically originates from an organic porogen, such as a polymer particle or another porogen, that during conversion of the coating formulation into a functional coating typically will be decomposed, burned, evaporated or otherwise removed. Porogens include organic neutral, cationic and anionic polymers or polylectrolytes (see e.g. Fuji, M.; Takai, C.; Rivera Virtudazo, R. V.; *Adv. Powder Tech.*, 2014, 25, 91-100; Zhang, X. et al., *App. Mater. Interfaces,* 2014, 6, 1415-1423)

In the present disclosure the pore typically originates from an organic porogen, such as a polymer particle or another porogen, that during conversion of the coating formulation into a functional coating typically will be decomposed, burned, evaporated or otherwise removed. It should be observed that conversion does not encompass polymerization of organic (monomeric) compounds as the binder is an inorganic oxide based binder and the conversion therefore is of a sintering type conversion where organics are at least partially removed and metal oxide particles at least partially sinter together.

In addition to porogen pores, smaller pores are also present at least in the binder. In the context of the present invention, binder pores are therefore pores with a diameter of 1 to below 10 nm. Binder pores are typically not regular but extended pores in non-contacting regions between adjacent particles of binder, dense inorganic oxide particles and hollow nano particles (if present) and may form a network, which may or may not be in connection with the surface of the coating or with the porogen pores.

The coating according to the invention is a porous coating. By porous is herein meant that the coating has pores and a porosity of at least 2%. The maximum porosity depends on mechanical requirements of the coating layer and is typically 50% or less, preferably the porosity is less than 45% and more preferably the porosity is less than 40%. In an aspect such coating layer has a porosity of 2 to 50%. A high porosity generally increases anti-reflective performance but may reduce mechanical strength of a coating. In an aspect the porous anti-reflective coating layer has of porosity of 2% or more, 5% or more, 10% or more, 15% or more, 20% or more, 25% or more, 30% or more. In an aspect the porous anti-reflective coating layer has of porosity 50% or less, 45% or less, 40% or less. In an aspect the porous anti-reflective coating layer has of porosity of 25 to 40%. In an aspect the porous anti-reflective coating layer has of porosity of 30 to 40%.

The porous anti-reflective coating layer may also be referred to herein as coating or anti-reflection coating.

As is well known by the skilled person, image analysis may suitably be performed on a SEM photo. The skilled person will be able to perform image analysis on a SEM photo of a cross section of the coating layer orthogonal to the substrate to determine that the amount of pores having a smallest dimension of at least 10 nm in the region of the AR coating closest to the surface of the substrate is smaller than the amount of pores having a smallest dimension of at least 10 nm in the region of the AR coating closer to the atmosphere.

As a result the skilled person is able to determine if the first layer has a different porosity than the second layer. Alternatively ellipsometry may be used for this purpose.

Alternatively the skilled person may calculate the porosity from a measured refractive index (RI). Knowing the RI of a coating material without any pores, the skilled person can calculate how much air/pore volume is present in the coating layer. The coating material herein is the total inorganic oxide material after convert the coating formulation into a functional coating for example by heating.

Total inorganic oxide material includes all inorganic oxide material in the coating e.g. material of the binder, plus the material of the inorganic oxide shell, plus aluminium containing compound(s).

In an aspect porosity is determined by image analysis on a SEM photo of a cross section of the coating layer orthogonal to the substrate.

In an aspect of the invention the coating layer of the coated substrate has a porosity of 2 to 50%.

The coating according to the invention also comprises elongated dense inorganic oxide particles with an aspect ratio of at least 2, and a smaller diameter in the range of 3 to 20 nm. Preferably the smaller diameter is in the range of 5 to 20 nm. By elongated is meant that at least one of the dimensions of the particle is much longer, such as at least 2, 3, 4, 5, 8, 10, 15 or 20 times the length of another dimension of the particle. It is preferred that the length of the elongated dense inorganic oxide particle is less than 50 times the length of another dimension of the particle, such as at most, 50, 30, 25, 20 or 15 times the length of another dimension of the particle. When the particle has an irregular shape, the aspect ratio is calculated as the length of the longest straight line from one side of the particle to the other side of the particle (even though this may mean that the straight line may be outside the particle) divided by the shortest dimension of the particle transverse to the longest straight line anyway along the straight line. Examples of elongated dense inorganic oxide particles are IPA-ST-UP (Nissan Chemical) and Levasil CS15/175 (Akzo Nobel) and others are commercially available. Further examples include Levasil CS8-490 and Levasil CS15-150 (Akzo Nobel). Typically the elongated particle has a diameter that is less than its length. In an aspect the elongated dense particles comprises an elongated silica particle having a diameter of from 1 to 30 nm and a length of from 10 to 200 nm.

In an aspect the elongated dense particle comprises an elongated silica particle having a diameter from 9 to 15 nm and a length of length from 40 to 100 nm. IPA-ST-UP (Nissan Chemical) is an example of an elongated silica particle having a diameter of from 9 to 15 nm, and a length of length: 40-100 nm.

In an aspect the elongated dense particles is an elongated silica particle having a diameter of from 1 to 30 nm and a length of from 10 to 200 nm.

In an aspect the elongated dense particle is an elongated silica particle having a diameter from 9 to 15 nm and a length of length from 40 to 100 nm. IPA-ST-UP (Nissan Chemical) is an example of an elongated silica particle having a diameter of from 9 to 15 nm, and a length of length: 40-100 nm.

IPA-ST-UP herein refers to ORGANOSILICASOL™ IPA-ST-UP.

The elongated particle has an aspect ratio of at least two and may, without being limited thereto, have an ellipsoidal, a rod-like or an irregular shape. The elongated particle as used in the invention has a longer axis (which may also be referred to as major) having length x1; and a shorter axis perpendicular to the longer axis (which may also be referred to as minor) having a length x2; and an aspect ratio (x1/x2) of at least two.

The aspect ratio is calculated by dividing the length of the longest axis by the smaller axis. The longest axis may also be referred to as major axis. The smaller axis may also be referred to as the minor axis, the smaller diameter or the shortest dimension of the particle. Typically for determining the length of an axis of a particle the outside surface of the particle is used.

By dense is meant that the inorganic oxide particle has low or no porosity, such as a porosity of less than 5 vol-% or no porosity. In an aspect the elongated dense inorganic oxide particle has a porosity of 0.5-5 vol-%, in an aspect 1-4 vol-%, in an aspect 1-3 vol-% porosity.

By porogen is herein meant an entity capable of forming pores with a diameter of 10 to 120 nm, preferably 30 to 100 nm, in the final coating may for example be hollow particle; a core-shell particle with a core with a boiling point below the curing temperature of the coating formulation or a core, which is combustable or depolymerizable below the curing temperature; a particle, which is combustable or depolymerizable below the curing temperature. Porogen may also be referred to as pore forming agent. A core with a boiling point below the curing temperature boiling point has a decomposition temperature of below the curing temperature. A core which is combustable or depolymerizable below the curing temperature is a core that is decomposed or depolymerized, or a combination thereof, during curing, i.e. at a temperature which is below the curing temperature. As a result the core is removed and a pore is formed.

Thus by porogen, or pore forming agent, is herein meant an entity capable of forming pores with a diameter of 10 to 120 nm, preferably 30 to 100 nm, in the final coating. The porogen may be a polymer particle e.g. a polystyrene particle, Pluronic P123 and/or a PMMA particle. The porogen may for example be hollow particle. The porogen may for example be a hollow silica particle. The porogen may for example be a core-shell particle with a core having a boiling point below the curing temperature of the coating formulation. The porogen may be a core-shell particle with a core that is combustable or depolymerizable below the curing temperature or a particle, that is combustable or depolymerizable below the curing temperature. A core having a boiling point below the curing temperature comprises a material having boiling point of below the curing temperature. A core which is combustable or depolymerizable below the curing temperature comprises a material that is decomposed or depolymerized, or a combination thereof, during curing, i.e. at a temperature below the curing temperature. As a result the compound is removed and a pore is formed. The porogen may be a core-shell particle, wherein the core comprises a core material; such as an organic compound, and the shell comprises an inorganic oxide.

By oxide equivalents of inorganics is herein meant the metal oxides including silicon oxide irrespective of the actual compound that the inorganic species is present in so for example tetraethoxysilane would count as $SiO_2$ irrespective if the species present is tetraethoxysilane, partially hydrolysed tetraethoxysilane or $SiO_2$. i.e. by oxide equivalents of inorganics is herein meant the equivalent amount of metal oxides including silicon oxide that can be formed from the actual compound or inorganic oxide precursor used. So for example a certain amount of tetraethoxysilane would be expressed as $SiO_2$ equivalent irrespective if the species present is tetraethoxysilane, partially hydrolysed tetraethoxysilane or $SiO_2$. Analogous for Alumina, one calculates the amount of pure $Al_2O_3$ that could be formed. Aluminum oxide equivalents are calculated back to theoretical $Al_2O_3$ amount based on the alumina precursor added to the formulation.

The alumina precursor may include
- Al(III) complexes such as halogen-based salts of Al(III) in the form of AlX3 where X can be F, Cl, Br, I and their hydrate form;
- Al(III) inorganic salts such as Al(III) nitrates, nitrites, sulfites, sulfates, phosphates, chlorates, perchlorates, carbonates and their hydrate form;
- Al(III) complexes bearing oxygen or nitrogen donor based ligands which are hydrolysable such as alkoxides or amides; and
- combinations thereof.

The alumina precursor may include any of Al(isopropoxide)3, Al(sec-butoxide)3, Al(NO3)3, AlCl3 or a combination thereof.

The silica precursor may include TEOS (tetraethoxysilane), TMOS (tetramethoxysilane), alkylsilanes such as (R)xSi(OCH3)4-x where R=CH3; C2H5; OCH3 of OC2H5 or a combination thereof.

In an aspect the inorganic oxide equivalents of the coating formulation are based on total ash rest after combustion at 600° C., 2 min in air. As the skilled person knows total ash rest after combustion at 600° C., 2 min in air is the total residual solid material after combustion at 600° C., 2 min in air.

For instance for silica, one starts from alkoxysilane. When it is referred to oxide equivalents, the assumption is made that only pure $SiO_2$ is formed. Analogous for Alumina, if started from Al(NO3)3 one calculates the amount of pure $Al_2O_3$ that could be formed.

For example for 10 grams of tetraethyl orthosilicate (TEOS), the amount of inorganic oxide equivalents is calculated as follows:

$$\text{eq. } SiO_2 = \frac{\text{amount } TEOS[g]}{Mw\ TEOS} * Mw\ SiO_2$$

i.e. eq. $SiO_2 =$ oxide equivalents of inorganics $= 10/208.33 * 60.08 = 2.88$ g For example for 1 gram elongated dense inorganic oxide particles with an aspect ratio of at least 2 and an average smaller diameter in the range of 3 to 20 nm), the amount of inorganic oxide equivalents is calculated as follows:

The elongated particles used in the examples are considered to be pure SiO2. So 1 gram elongated particles, is equivalent to 1 g inorganic oxide (here 1 gram SiO2).

The wt % alumina in the coating formulation may be expressed as $$Al_2O_3\ wt\ \% = \frac{\text{weight } Al_2O_3}{\text{weight } Al_2O_3 + \text{weight } SiO_2} * 100$$

In one embodiment, the porogen account for a significant part of the total amount of inorganic oxide in the coating formulation. Preferably, the porogen accounts for 10 to 75 wt-% of the total amount of inorganic oxide in the second coating formulation, and more preferably the porogen accounts for 20 to 50 wt-% of the total amount of inorganic oxide in the second coating formulation. This may for example be the situation when the porogen is a core shell particle or a hollow particle.

The inorganic oxide may be any oxide known from glass coatings. The inorganic oxide may be any known from glass coatings including metal oxides such as for example $Al_2O_3$, $SiO_2$, $TiO_2$, $ZrO_2$, oxides of lanthanides and mixtures (including mixed oxides) thereof. The inorganic oxide may be any known from glass coatings including metal oxides, compounds and mixtures comprising for example $Al_2O_3$, $SiO_2$ and optionally one or more of of Li2O, BeO, BaO, MgO, K2O, CaO, MnO, NiO SrO, FeO, Fe2O3, CuO, Cu2O, CoO, ZnO, PbO, GeO2, SnO2, Sb2O3, Bi2O3. It is preferred that the inorganic oxide contains silica, preferably the inorganic oxide contains at least 50 wt-% silica and more preferably the inorganic oxide is at least 90 wt-% silica, such as the inorganic oxide consisting of silica.

The coated substrate according to the invention may for example be prepared by a method as described herein. Such method comprises steps of providing a substrate; providing a coating formulation; apply the coating formulation on the substrate; drying the coating formulation on the substrate; and converting the coating formulation on the substrate into a coated substrate. It should be observed that the conversion does not involve polymerization of an organic polymer but rather a consolidation of the binder and/or conversion of the porogen into a pore in the coating.

In such situation, a substrate comprising applied coating formulations as described herein is converted into a coated substrate by exposing the applied coating formulations to a temperature of below 250° C. In an aspect by exposing the applied coating formulations to a temperature of below 200, below 175 or below 150° C. After performing any one of the methods according to the invention typically this will results in a coated substrate comprising at least two coating layers on the first surface.

An anti-reflective coating comprising IPA-ST-UP particles (elongated particles) and inorganic binder is disclosed in WO2007/093341. However, WO2007/093341 does not indicate any relevance to durability properties and does not disclose presence of pores having a diameter of 10-120 nm in the coating, and particularly not pores of a diameter of 30-100 nm.

When the coating is applied to a substrate, such as a glass sheet, the coating will have an inner surface facing towards the substrate and an outer surface facing away from the substrate. In one embodiment, the elongated dense inorganic oxide particles are not distributed homogeneously in the second coating. Particularly, it was found to be advantageous that the mass ratio of inorganic oxide originating from elongated dense inorganic oxide particles to total inorganic oxide of the coating is higher in or near the outer surface of the second coating. Here, outer surface refers to the surface of the coating away from the substrate, which surface typically is exposed to the atmosphere.

$$\left(\frac{M_{elongated\ massive\ metal\ oxide\ particles}}{M_{total\ metal\ oxide}}\right)_{Surface} > \left(\frac{M_{elongated\ massive\ metal\ oxide\ particles}}{M_{total\ metal\ oxide}}\right)_{Average}$$

The distribution may for example be determined by STEM-EDX or by depth profiling. Thus the distribution of elongated dense inorganic oxide particles in a coating may for example be determined by STEM-EDX or by depth profiling. This is particularly advantageous when the chemical composition of the dense inorganic oxide particles and the overall formulation is not the same.

In an aspect of the coating according to the invention the mass ratio of inorganic oxide originating from elongated dense inorganic oxide particles to total inorganic oxide of the coating is higher in or near the outer surface of the coating as compared to a reference coating. A suitable reference coating may be a coating without elongated dense inorganic oxide particles.

It was found to be advantageous if the ratio is higher in the 20 nm of the coating closest to the outer surface than the average mass ratio of the inorganic oxide originating from elongated dense inorganic oxide particles to total inorganic oxide of the coating. In an aspect the ratio of inorganic oxide originating from elongated dense inorganic oxide particles to total inorganic oxide of the coating is at least 50% higher in the 20 nm of the coating closest to the outer surface compared to the average ratio of the inorganic oxide originating from elongated dense inorganic oxide particles to total inorganic oxide of the coating. Particularly, it was found to be advantageous when the ratio is higher in the 20 nm of the coating closest to the outer surface that the average mass ratio of the inorganic oxide originating from elongated dense inorganic oxide particles to total inorganic oxide of the coating. Preferably the ratio of inorganic oxide originating from elongated dense inorganic oxide particles to total inorganic oxide of the coating is at least 50% higher in the 20 nm of the coating closest to the outer surface that the average ratio of the inorganic oxide originating from elongated dense inorganic oxide particles to total inorganic oxide of the coating, and more preferably the ratio of inorganic oxide originating from elongated dense inorganic oxide particles to total inorganic oxide of the coating is at least twice as high in the 20 nm of the coating closest to the outer surface that the average ratio of the inorganic oxide originating from elongated dense inorganic oxide particles to total inorganic oxide of the coating. It could be theorized without being limited thereto that improved durability properties associated with this distribution of the elongated dense inorganic oxide particles is related to the slight change in surface morphology observed when elongated dense inorganic oxide particles are arrange near or at the surface of the coating.

In an aspect the coated substrate according to the invention demonstrates the mass ratio of inorganic oxide originating from the elongated dense inorganic oxide particles to total inorganic oxide of the coating being higher in a 20 nm thick top layer of the coating closest to the outer surface of the coated substrate than the average mass ratio of the inorganic oxide originating from dense inorganic oxide particles to total inorganic oxide of the coating.

In an aspect the mass ratio of inorganic oxide originating from the dense inorganic oxide particles to total inorganic oxide of the coating is at least 50% higher in the top layer of the second coating layer than the average mass ratio of the inorganic oxide originating from elongated dense inorganic oxide particles to total inorganic oxide of the coating.

In an aspect the invention provides a coated substrate obtainable by the method of preparing a coated substrate according to the invention, demonstrating improved durability properties.

The substrate is a solid material, such as a polymer sheet or a glass member. The substrate may include quartz or polymer foil, such as glass foil. Examples of polymer substrates are plastic foils and polymers based on one or more of the polymers selected from Polyethylene terephthalate (PET), Polymethyl methacrylate (PMMA), Polyethylene naphthalate (PEN), polycarbonate (PC). A further example of a polymer substrate includes polyimide (PI). Polymer substrates are advantageous for flexible solar cells. Preferably the substrate is transparent. In an aspect the coated substrate is having an average transmission of at least 80% in the range of 380-1100 nm.

Preferably, the substrate is a glass member being selected from the group of float glass, chemically strengthened float glass, borosilicate glass, structured glass, tempered glass and thin flexible glass having thickness in the range of for example 20 to 250 µm such as 50 to 100 µm as well as substrates comprising a glass member, such as a partially or fully assembled solar module and an assembly comprising a glass member. The glass member may be SM glass or MM glass. A commercially available MM glass includes Interfloat GMB SINA 3.2 mm solar glass for photovoltaic applications.

In an aspect of the invention the coated substrate is a cover glass for a solar module.

The invention further relates to a solar module comprising a coated substrate as described herein.

Solar modules are modules typically comprise a glass member forming at least a part of the first surface of the substrate and at least one member selected from the group consisting of thin film transparent conductive and/or semiconductor layers, a back sheet, an encapsulant, solar cells, an electrical conducting film, wiring, controller box and a frame.

The glass member may be selected from the group of float glass, chemically strengthened float glass, borosilicate glass, structured glass, tempered glass and thin flexible glass having thickness in the range of for example 20 to 250 µm such as 50 to 100 µm. Preferred substrates for the method according to the invention are hence tempered glass, chemically strengthened glass and substrates comprising temperature sensitive components, such as partially or fully assembled solar cell modules.

The coating according to the invention is preferably an anti-reflective coating. In an aspect according to the invention the coated substrate demonstrates an ARE of at least 2%, at least 3%, at least 4%, at least 5%.

In an aspect the coated substrate according to the invention demonstrates a substrate-coating anti-reflective effect, ARE, with $$ARE = T_{Coated\ substrate,0} - T_{Substrate,0}$$

of at least 2%, preferably the ARE is at least 3%, more preferably the ARE is at least 4%, where T is the average transmittance in the wavelength range from 380-1100 nm as measured by an Optosol Transpec VIS-NIR, Substrate refers to substrate without coating, Coated substrate refers to the substrate with double sided coating and 0 refers to before PCT test.

The coating according to the invention is particularly suitable for lowering the reflectivity of a substrate for example any type of glass substrate, hence being used as an anti-reflective coating.

In another aspect of the second coating formulation comprises a porogen capable of forming pores with a diameter of 10-120 nm, elongated dense inorganic oxide particles with an aspect ratio of at least 2 and a smaller diameter in the range of 3 to 20 nm, an inorganic binder, a solvent and 0.5 to 30 wt-% aluminium oxide equivalents of aluminium containing compound. Aluminium and aluminum are used interchangeably herein. In an aspect the aluminium oxide equivalents of aluminium containing compound are based on total ash rest after combustion at 600° C., 2 min in air. The aluminium may be provided for example as metal oxide powder, but more preferably as an organic or inorganic salt optionally in solution or suspension. In a preferred embodiment, the second coating formulation comprises between 1.0 to 25 wt-% aluminium oxide equivalents of aluminium containing compound as it was found that the stability in the sense of shelf life was best for aluminium concentrations in this range. Stability refers to the stability of the second coating formulation. The stability of the second coating formulation may be assessed by looking at the homogeneity of the coating formulation. An inhomogeneous coating formulation indicates a low stability and low shelf life. The inhomogeneity of the formulation can be directly observed by the presence of sediments or gellation in the liquid formulation or can be measured by DLS (Dynamic Light Scattering) via the growth or aggregation of colloidal particles in the suspension over time. Using an inhomogeneous coating formulation typically results in a non-homogeneous coating.

The porogen may for example be hollow inorganic oxide particles, or core-shell particles having an inorganic oxide (or inorganic oxide precursor) shell and a core comprising an organic compound, such as a cationic polymer. The porogen may also be an organic porogen, such as organic nano particle like for example an organic polymeric nano-particle or another porogen, that during conversion of the coating formulations into a functional coating typically will be decomposed, burned, evaporated or otherwise removed. By organic nano particle is herein meant a particle comprising one or more organic molecules and having a size in the range of 50 to 150 nm. Examples of organic molecules are polymers, such as acrylic polymers and latexes; and oligomers. The elongated dense inorganic oxide particle is discussed above.

In an aspect of the invention the porogen accounts for 10 to 75 wt-% of the total amount of inorganic oxide equivalents in the second coating formulation. In an aspect the porogen accounts for 20 to 50 wt-% of the total amount of inorganic oxide equivalents in the second coating formulation.

The inorganic binder typically comprises inorganic oxide particles with a diameter in the range of 0.1 to 7 nm and/or an inorganic oxide precursor with a diameter in the range of 0.1 to 7 nm. The inorganic binder is preferably an inorganic oxide particle or inorganic oxide precursor with a diameter in the order of 0.1 to 7 nm.

It is noted that the inorganic oxide particles may have a diameter of more than 7 nm, e.g. in the range of 7 to 10 nm. It is noted that the inorganic oxide precursor may have a diameter of more than 7 nm, e.g. in the range of 7 to 10 nm.

In an aspect of the invention the inorganic binder comprises inorganic oxide nano particles with an average diameter in the range of 0.1 to 7 nm.

In an aspect the inorganic binder typically comprises inorganic oxide particles with a diameter in the range of 0.1 to 5 nm and/or an inorganic oxide precursor with a diameter in the range of 0.1 to 5 nm.

The diameter of the inorganic oxide particle and/or the inorganic oxide precursor may be measured with Dynamic Light Scattering (DLS). Examples are pre oligomerized silicium alkoxide such as pre oligomerized tetraethoxysilane, pre oligomerized titanium alkoxide and metal oxide sol gels. An example of an inorganic oxide particle and/or the inorganic oxide precursor includes metal oxide sols. Pre oligomerized silicium alkoxide is also referred to by the skilled person as pre oligomerized silicon alkoxide. An inorganic binder may for example be prepared as described in WO 2009/106456 (incorporated herein by reference).

The coating formulations described herein comprise a solvent. The solvent can be any solvent, combination of solvents or combination of solvents and additives, such as surfactants and stabilizers, that can realize a stable dispersion of the coating formulation. Typically, the solvent accounts for 80-98% of the mass of the coating formulation. Highly suitable solvents are isopropanol (IPA), water or combinations of solvents including IPA and/or water.

Another aspect of the invention concerns a solar module comprising a coated substrate according to the invention. Another aspect of the invention concerns a solar module comprising a coated substrate as described herein. Such solar module exhibits significantly better performance over time at lower operational costs. The increased durability as provided by the disclosure herein, may provide an increased power output as measured over lifetime of the solar module. Other advantageous devices comprising the coated substrate according to the invention are greenhouse glass (or polymer membrane), concentrated solar modules, windows, displays. In some applications, such as for example roof top coating or container surfaces, the substrate may be non-transparent and the advantage of the invention is there focused on the improved durability of the coated substrate.

The coating formulation may be applied to a substrate by any known technique in the art, for example dipping, brushing, spraying, spinning, slot die coating, aerosol coating or via the use of a roller. Spraying can be airless or with the use of conventional air, or electrostatic, or high volume/low pressure (HVLP) or aerosol coating. It is preferred that the coating formulation is applied by roll coating, aerosol coating or dip coating.

By functional coating is meant a coating that enhances mechanical, optical and/or electrical properties of the substrate to which the functional coating is attached. Examples of possible enhanced mechanical properties of a substrate coated with the coating of the invention are increased surface hardness, increased stiffness or wear properties as compared to the mechanical properties of the uncoated substrate. Examples of possible enhanced optical properties of a substrate coated with the coating of the invention are increased light transmittance from air through the functional coating and substrate compared to light transmittance directly from air through the substrate, and reduced reflectance from the interphase from air to the functional coating and the functional coating to the substrate compared to the reflectance directly from air to uncoated substrate. Examples of possible enhanced electrical properties of a substrate coated with the coating of the invention are increased conductivity as compared to the unconverted coating and/or to the uncoated substrate.

Another aspect of the invention concerns the use of a coating formulation comprising elongated inorganic oxide particles with an aspect ratio of at least 2 and a smaller diameter in the range of 3 to 20 nm for improving durability properties of a substrate. Particularly, this embodiment concerns a coating formulation comprising core-shell nanoparticle as porogen where the core comprises an organic compound, such as a cationic, and the shell comprises an inorganic oxide, and between 0.5 to 20 wt-% aluminium oxide equivalents of aluminium containing compound based on total ash rest after combustion at 600° C., 2 min in air. The amount of aluminium oxide equivalents of aluminium containing compound in the ash rest of the coating formulation may be determined via ICP-MS.

Another aspect of the invention includes the use of a coating formulation as described herein for improving durability properties of a substrate, such as a cover glass for a solar module. Another aspect of the invention includes the use of a coating formulation comprising elongated dense inorganic oxide particles with an aspect ratio of at least 2 and a smaller diameter in the range of 3 to 20 nm for improving durability properties of a substrate, wherein the coating formulation comprises core-shell nanoparticles as porogen, wherein the core comprises an organic compound, the shell comprises a inorganic oxide; and the formulation comprises between 0.1 to 30 wt-% aluminium oxide equivalents of aluminium containing compound.

Another aspect of the invention includes the use of the combination of
- elongated dense inorganic oxide particles having an aspect ratio of at least 2 and a smaller diameter in the range of 3 to 20 nm; and
- an aluminium containing compound,
to improve durability properties of a substrate.

Another aspect of the invention includes the of the kit as described to improve the durability of a AR coated substrate, preferably an AR coated glass substrate.

Embodiments of the invention include the following:
1. A kit of parts for providing an antireflective coating having an improved property on a cover glass for use in a solar module, comprising
   (a) A first container comprising a first coating formulation comprising an inorganic oxide binder and a solvent; and
   (b) A second container comprising a second coating formulation comprising
      i. at least 2 wt-% based on inorganic oxide equivalents of elongated dense inorganic oxide particles with an aspect ratio of at least 2 and a smaller diameter in the range of 3 to 20 nm;
      ii. a porogen capable of forming pores with a diameter in the range of 10 to 120 nm;
      iii. an inorganic oxide binder; and
      iv. a solvent,
         wherein the second coating formulation comprises 0 to 30 wt-% aluminium oxide equivalents of aluminium containing compound, based on total ash rest after combustion at 600° C., 2 min in air, as measured using ICP-MS.
2. The kit according to any one of the preceding embodiments, wherein the elongated dense oxide particles have an aspect ratio of at least 2 and an average smaller diameter in the range of 3 to 20 nm as measured from at least one TEM image.
3. The kit according to any one of the preceding embodiments, wherein the elongated dense oxide particles comprise elongated silica particles having an average diameter of from 2 to 20 nm and an average length of from 10 to 60 nm, preferably as measured from at least one TEM image.
4. The kit according to any one of the preceding embodiments, wherein the elongated dense oxide particles comprise elongated silica particles having an average diameter of from 3 to 20 nm and an average length of from 30 to 150 nm, preferably as measured from at least one TEM image.
5. The kit according to any one of the preceding embodiments, wherein the elongated dense oxide particles comprise e elongated silica particles having an average diameter of from 4 to 15 nm and an average length of from 40 to 100 nm, preferably as measured from at least one TEM image
6. The kit according to any one of the preceding embodiments, wherein the elongated dense oxide particles are elongated silica particles having an average diameter of from 3 to 20 nm and an average length of from 30 to 150 nm, preferably as measured from at least one TEM image.
7. The kit according to any one of the preceding embodiments, wherein the elongated dense oxide particles are elongated silica particles having an average diameter of from 4 to 15 nm and an average length of from 40 to 100 nm, preferably as measured from at least one TEM image.
8. The kit according to any one of the preceding embodiments, wherein the second coating formulation comprises from 2 to 50 wt % based on inorganic oxide equivalents of elongated dense inorganic oxide particles.
9. The kit according to any one of the preceding embodiments, wherein the second coating formulation comprises from 10 to 30 wt % based on inorganic oxide equivalents of elongated dense inorganic oxide particles.
10. The kit according to any one of the preceding embodiments, wherein the second coating formulation comprises from 15 to 30 wt % based on inorganic oxide equivalents of elongated dense inorganic oxide particles.
11. The kit according to any one of the preceding embodiments, wherein the second coating formulation comprises from 2 to 40 wt % based on inorganic oxide equivalents of elongated dense inorganic oxide particles.
12. The kit according to any one of the preceding embodiments, wherein the second coating formulation comprises from 2 to 35 wt % based on inorganic oxide equivalents of elongated dense inorganic oxide particles.
13. The kit according to any one of the preceding embodiments, wherein the second coating formulation comprises from 2 to 30 wt % based on inorganic oxide equivalents of elongated dense inorganic oxide particles.
14. The kit according to any one of the preceding embodiments, wherein the second coating formulation comprises from 2 to 25 wt % based on inorganic oxide equivalents of elongated dense inorganic oxide particles.
15. The kit according to any one of the preceding embodiments, wherein the second coating formulation comprises from 3 to 40 wt % based on inorganic oxide equivalents of elongated dense inorganic oxide particles.
16. The kit according to any one of the preceding embodiments, wherein the second coating formulation comprises from 4 to 30 wt % based on inorganic oxide equivalents of elongated dense inorganic oxide particles.
17. The kit according to any one of the preceding embodiments, wherein the second coating formulation comprises from 5 to 30 wt % based on inorganic oxide equivalents of elongated dense inorganic oxide particles.
18. The kit according to any one of the preceding embodiments, wherein the second coating formulation comprises from 10 to 40 wt % based on inorganic oxide equivalents of elongated dense inorganic oxide particles.
19. The kit according to any one of the preceding embodiments, wherein the second coating formulation com- 19. ...prises from 15 to 40 wt % based on inorganic oxide equivalents of elongated dense inorganic oxide particles.
20. The kit according to any one of the preceding embodiments, wherein the second coating formulation comprises from 15 to 30 wt % based on inorganic oxide equivalents of elongated dense inorganic oxide particles.
21. The kit according to any one of the preceding embodiments, wherein the second coating formulation comprises 0.1 to 25 wt-% aluminium oxide equivalents of aluminium containing compound.
22. The kit according to any one of the preceding embodiments, wherein the second coating formulation comprises 0.5 to 22 wt-% aluminium oxide equivalents of aluminium containing compound.
23. The kit according to any one of the preceding embodiments, wherein the second coating formulation comprises 0.5 to 20 wt-% aluminium oxide equivalents of aluminium containing compound.
24. The kit according to any one of the preceding embodiments, wherein the second coating formulation comprises 1 to 15 wt-% aluminium oxide equivalents of aluminium containing compound.
25. The kit according to any one of the preceding embodiments, wherein the first coating formulation comprises a porogen capable of forming pores with a diameter in the range of 1 to 120 nm.
26. The kit according to any one of the preceding embodiments, wherein the first coating formulation comprises a porogen capable of forming pores with a diameter in the range of 10 to 120 nm.
27. The kit according to any one of the preceding embodiments, wherein the wt % organic porogen material in the first coating formulation is in the range from 1 to 30 wt %.
28. The kit according to any one of the preceding embodiments, wherein the wt % organic porogen material in the first coating formulation is in the range of 2 to 20 wt %.
29. The kit according to any one of the preceding embodiments, wherein the wt % organic porogen material in the first coating formulation is in the range of 5 to 25 wt %.
30. The kit according to any one of the preceding embodiments, wherein the wt % organic porogen material in the first coating formulation is in the range of 5 to 20 wt %.
31. The kit according to any one of the preceding embodiments, wherein the wt % organic porogen material in the first coating formulation is in the range of 5 to 18 wt %.
32. The kit according to any one of the preceding embodiments, wherein the wt % organic porogen material in the first coating formulation is in the range of 5 to 15 wt %.
33. The kit according to any one of the preceding embodiments, wherein the wt % organic porogen material in the second coating formulation is in the range of 20 to 50 wt %.
34. The kit according to any one of the preceding embodiments, wherein the wt % organic porogen material in the second coating formulation is in the range of 20 to 37 wt %.
35. The kit according to any one of the preceding embodiments, wherein the wt % organic porogen material in the second coating formulation is in the range of 20 to 35 wt %.
36. The kit according to any one of the preceding embodiments, wherein the wt % organic porogen material in the second coating formulation is in the range of 20 to 32 wt %.
37. The kit according to any one of the preceding embodiments, wherein the wt % organic porogen material in the second coating formulation is in the range of 20 to 30 wt %.
38. The kit according to any one of the preceding embodiments, wherein the wt % organic porogen material in the second coating formulation is in the range of 20 to 28 wt %.
39. The kit according to any one of the preceding embodiments, wherein the wt % organic porogen material in the second coating formulation is in the range of 21 to 32 wt %.
40. The kit according to any one of the preceding embodiments, wherein the wt % organic porogen material in the second coating formulation is in the range of 21 to 28 wt %.
41. The kit according to any one of the preceding embodiments, wherein wt % organic porogen material in the first coating formulation is less than the wt % organic porogen material in the second coating formulation.
42. The kit according to any one of the preceding embodiments, wherein the porogen comprises core-shell nanoparticles where the core comprises an organic compound and the shell comprises an inorganic oxide.
43. The kit according to any one of the preceding embodiments, wherein the organic compound comprises a polymer.
44. The kit according to any one of the preceding embodiments, wherein the organic compound comprises a cationic polymer.
45. The kit according to any one of the preceding embodiments, wherein the cationic polymer comprises poly(meth)acrylate and/or a copolymers thereof.
46. The kit according to any one of the preceding embodiments, wherein the porogen comprises a cationically stabilized co-polymer micelle.
47. The kit according to any one of the preceding embodiments, wherein the porogen comprises a cationically a diblock or triblock copolymer.
48. The kit according to any one of the preceding embodiments, wherein the porogen comprises a cationically stabilized latex.
49. The kit according to any one of the preceding embodiments, wherein the porogen comprises a hollow particle, preferably as a hollow silica particle.
50. The kit according to any one of the preceding embodiments, wherein the porogen comprises block copolymers obtained from ethylene oxide and propylene oxide.
51. The kit according to any one of the preceding embodiments, wherein the porogen comprises triblock copolymer comprising poly(ethylene oxide) (PEO) and poly(propylene oxide) (PPO).
52. The kit according to any one of the preceding embodiments, wherein the porogen comprises core-shell nanoparticle where the core comprises an organic compound, such as a cationic polymer, and the shell comprises an inorganic oxide; and hollow inorganic nanoparticles.

53. The kit according to any one of the preceding embodiments, wherein the porogen in the first composition is different from the porogen in the second composition.
54. The kit according to any one of the preceding embodiments, wherein the porogen in the first composition is the same as the porogen in the second composition.
55. The kit according to any one of the preceding embodiments, wherein the porogen in the first coating formulation comprises a combination of the porogens described in any of the preceding embodiments.
56. The kit according to any one of the preceding embodiments, wherein the porogen in the second coating formulation comprises a combination of the porogens described in any of the preceding embodiments.
57. The kit according to any one of the preceding embodiments, wherein the porogen comprises
    core-shell nanoparticle where the core comprises an organic compound as defined in any of the preceding embodiments, and the shell comprises an inorganic oxide;
    and hollow inorganic nanoparticles.
58. The kit according to any one of the preceding embodiments, wherein the porogen has an average size of 20-150 nm as measured using DLS.
59. The kit according to any one of the preceding embodiments, wherein the porogen has an average size of 30-120 nm as measured using DLS.
60. The kit according to any one of the preceding embodiments for use in the production of a cover glass for a solar module, wherein the first coating formulation is applied before the first coating formulation.
61. The kit according to any one of the preceding embodiments, wherein the improved property includes an improved durability as measured using a pressure cooker test (PCT—24 hr) test as compared with a reference.
62. The kit according to any one of the preceding embodiments, wherein the improved property includes an improved durability as measured using a pressure cooker test (PCT—48 hr) test as compared with a reference.
63. The kit according to any one of the preceding embodiments, wherein the improved property includes a $\Delta E^*$ of less than 2.3 with respect to the gray axis, wherein $\Delta E^*$ is defined according to CIELAB values, using the CIE76 standard with a D65 illuminant.
64. The kit according to any one of the preceding embodiments, wherein the coated substrate demonstrates a substrate-coating anti-reflective effect, ARE, with $$ARE = T_{Coated\ substrate, 0} - T_{Substrate, 0}$$

of at least 2%, where T is the average transmittance in the wavelength range from 380-1100 nm, Substrate refers to substrate without coating, Coated substrate refers to the substrate with double sided coating and 0 refers to before PCT.
65. The kit according to any one of the preceding embodiments, wherein the substrate demonstrates an ARE of at least 3%.
66. The kit according to any one of the preceding embodiments, wherein the substrate demonstrates an ARE of at least 4%.
67. The kit according to any one of the preceding embodiments, wherein the substrate demonstrates an ARE of at least 5%.
68. The kit according to any one of the preceding embodiments, wherein the inorganic oxide binder comprises inorganic oxide nano particles with an average diameter in the range of 0.1 to 7 nm.
69. The kit according to any one of the preceding embodiments, wherein the inorganic oxide binder comprises inorganic oxide nano particles comprise at least one metal oxides selected from $Al_2O_3$, $SiO_2$, $TiO_2$ and $ZrO_2$.
70. A method of preparing a coated substrate comprising the steps of:
    providing a substrate having a first surface;
    applying a first coating formulation as defined in any one of the preceding embodiments on the first surface of the substrate;
    drying the applied first coating formulation to obtain the substrate comprising an at least partially covered first surface;
    applying a second coating formulation as defined in any one of the preceding embodiments on the at least partially covered first surface;
    optionally drying of the applied second coating formulation; and
    converting the substrate into a coated substrate.
71. A method of preparing a coated substrate comprising the steps of:
    g) providing a substrate having a first surface;
    h) providing a first coating formulation as defined in any one of the preceding embodiments;
    i) applying the first coating formulation on the first surface of the substrate;
    j) drying the applied first coating formulation to obtain the substrate comprising an at least partially coated first surface;
    k) providing a second coating formulation as defined in any one of the preceeding embodiments;
    l) applying the second coating formulation on the at least partially coated first surface of the coated substrate;
    m) drying the applied second coating; and
    n) converting the substrate comprising an at least partially further coated first surface into a coated substrate comprising at least two coating layers on the first surface.
72. The method according to any one of the preceding embodiments, wherein after drying the applied first coating formulation and before applying the second coating formulation on the at least partially coated first surface of the coated substrate, the substrate is cooled to temperature in the range of 20 to 40° C.
73. The method according to any one of the preceding embodiments, wherein drying of the applied first coating formulation occurs by exposing the first coating formulation on the first surface of the substrate to a temperature of 90-300° C. for 10 second to 5 minutes.
74. The method according to any one of the preceding embodiments, wherein converting the substrate into a coated substrate occurs via heating, such as by heating above 400 degrees Celsius, preferably for at least 1 minute.
75. The method according to any one of the preceding embodiments, wherein in step d) drying occurs by exposing the first coating formulation on the first surface of the substrate to a temperature of 90-300° C. for 10 second to 5 minutes.
76. A coated substrate, comprising a substrate, and
    an anti-reflective coating provided on a surface of the substrate, wherein the anti-reflective coating comprises a first coating layer provided on the surface of the substrate, a second coating layer contacting a surface of the first layer at a side opposite to the substrate, wherein the first layer comprises:
an inorganic oxide binder; and
and wherein the second layer comprises:
elongated dense inorganic oxide particles with an aspect ratio of at least 2 and a smaller diameter in the range of 3 to 20 nm;
0 to 30 wt-% aluminium oxide equivalents of aluminium containing compound;
an inorganic oxide binder; and
pores with a diameter in the range of 10 to 120 nm as measured using ellipsometry and/or electron microscopy.

77. The coated substrate according to any one of the preceding embodiments, wherein the wt-% aluminium oxide equivalents of aluminium containing compound in the antireflective coating is determined using STEM EDX.

78. The coated substrate according to any one of the preceding embodiments, wherein the first layer comprises pores with a diameter in the range of 10 to 120 nm as measured using ellipsometry and/or electron microscopy.

79. The coated substrate according to any one of the preceding embodiments, wherein the first coating layer comprises 2 to 20 vol % of pores as determined using ellipsometry.

80. The coated substrate according to any one of the preceding embodiments, wherein the first coating layer comprises 3 to 18 vol % of pores as determined using ellipsometry.

81. The coated substrate according to any one of the preceding embodiments, wherein the first coating layer comprises 4 to 16 vol % of pores as determined using ellipsometry.

82. The coated substrate according to any one of the preceding embodiments, wherein the first coating layer comprises 5 to 15 vol % of pores as determined using ellipsometry.

83. The coated substrate according to any one of the preceding embodiments, wherein the second coating layer comprises 20 to 50 vol % of pores . . . as determined using ellipsometry.

84. The coated substrate according to any one of the preceding embodiments, wherein the second coating layer comprises 20 to 40 vol % of pores as determined using ellipsometry.

85. The coated substrate according to any one of the preceding embodiments, wherein the second coating layer comprises 20 to 35 vol % of pores as determined using ellipsometry.

86. The coated substrate according to any one of the preceding embodiments, wherein the pores in the second coating layer comprises 22 to 30 vol % of pores as determined using ellipsometry.

87. The coated substrate according to any one of the preceding embodiments, wherein the first coating layer comprises less pores than the second layer.

88. The coated substrate according to any one of the preceding embodiments, wherein the elongated dense oxide particles have an aspect ratio of at least 2 and an average smaller diameter in the range of 3 to 20 nm as measured from at least one TEM image.

89. The coated substrate according to any one of the preceding embodiments, wherein the elongated dense oxide particles comprise elongated silica particles having an average diameter of from 2 to 20 nm and an average length of from 10 to 60 nm, preferably as measured from at least one TEM image.

90. The coated substrate according to any one of the preceding embodiments, wherein the elongated dense oxide particles comprise elongated silica particles having an average diameter of from 3 to 20 nm and an average length of from 30 to 150 nm, preferably as measured from at least one TEM image.

91. The coated substrate according to any one of the preceding embodiments, wherein the elongated dense oxide particles comprise e elongated silica particles having an average diameter of from 4 to 15 nm and an average length of from 40 to 100 nm, preferably as measured from at least one TEM image 92. The coated substrate according to any one of the preceding embodiments, wherein the elongated dense oxide particles are elongated silica particles having an average diameter of from 3 to 20 nm and an average length of from 30 to 150 nm, preferably as measured from at least one TEM image.

93. The coated substrate according to any one of the preceding embodiments, wherein the elongated dense oxide particles are elongated silica particles having an average diameter of from 4 to 15 nm and an average length of from 40 to 100 nm, preferably as measured from at least one TEM image.

94. The coated substrate according to any one of the preceding embodiments, wherein the second coating layer comprises from 2 to 60 wt % based on inorganic oxide equivalents of elongated dense inorganic oxide particles.

95. The coated substrate according to any one of the preceding embodiments, wherein the second coating layer comprises from 3 to 40 wt % based on inorganic oxide equivalents of elongated dense inorganic oxide particles.

96. The coated substrate according to any one of the preceding embodiments, wherein the second coating layer comprises from 4 to 30 wt % based on inorganic oxide equivalents of elongated dense inorganic oxide particles.

97. The coated substrate according to any one of the preceding embodiments, wherein the second coating layer comprises between 0.5 to 25 wt-% aluminium oxide equivalents of aluminium containing compound.

98. The coated substrate according to any one of the preceding embodiments, wherein the second coating layer comprises 0.5 to 22 wt-% aluminium oxide equivalents of aluminium containing compound.

99. The coated substrate according to any one of the preceding embodiments, wherein the second coating layer comprises 0.5 to 20 wt-% aluminium oxide equivalents of aluminium containing compound.

100. The coated substrate according to any one of the preceding embodiments, wherein the second coating layer comprises 1 to 15 wt-% aluminium oxide equivalents of aluminium containing compound.

101. The coated substrate according to any one of the preceding embodiments, wherein the first layer has a first layer thickness in the range of 20 to 180 nm as measured using ellipsometry on a coated substrate.

102. The coated substrate according to any one of the preceding embodiments, wherein the first layer has a first layer thickness, as measured using ellipsometry, in the range of from 20 to 180 nm and a refractive index n1 at an optical wavelength of 600 nm in the range of 1.48 to 1.30 as measured using ellipsometry.

103. The coated substrate according to any one of the preceding embodiments, wherein the second layer has a second layer thickness, as measured using ellipsometry, in the range of from 50 to 180 nm and a refractive index n2 at an optical wavelength of 600 nm in the range of 1.35 to 1.20 as measured using ellipsometry on a coated substrate.

104. The coated substrate according to any one of the preceding embodiments, wherein the refractive index of the substrate n0 at an optical wavelength of 600 nm is in the range from 1.60-1.48 as measured using ellipsometry and n0<n1<n2

105. The coated substrate according to any one of the preceding embodiments, wherein
the substrate is a glass substrate;
the first layer has a first layer thickness in the range from 50 to 180 nm, as measured using ellipsometry, and a refractive index n1 at an optical wavelength 600 nm in the range of 1.50-1.30 as measured using ellipsometry on a coated substrate; and
the second layer has a second layer thickness in the range from 50 to 180 nm, as measured using ellipsometry, and a refractive index n2 at an optical wavelength 600 nm in the range of 1.35-1.20 as measured using ellipsometry on a coated substrate.

106. The coated substrate according to any one of the preceding embodiments, wherein
the substrate is a glass substrate having a refractive index n0;
the first layer has a first layer thickness in the range from 50 to 180 nm, as measured using ellipsometry, and a refractive index n1 at an optical wavelength of 600 nm in the range of 1.50-1.30 as measured using ellipsometry on a coated substrate; and
the second layer has a second layer thickness in the range from 50 to 180 nm, as measured using ellipsometry, and a refractive index n2 at an optical wavelength 600 nm in the range of 1.35-1.20 as measured using ellipsometry on a coated substrate. and n0<n1<n2

107. The coated substrate according to any one of the preceding embodiments, wherein the second layer has a second layer thickness in the range of 50 to 180 nm and wherein sum of the first layer thickness and second layer thickness in the range of 100 to 360 nm and wherein the layer thickness is measured using ellipsometry.

108. The coated substrate according to any one of the preceding embodiments, wherein sum of the first layer thickness and second layer thickness in the range of 100 to 230 nm as measured using ellipsometry.

109. The coated substrate according to any one of the preceding embodiments, wherein sum of the first layer thickness and second layer thickness in the range of 150 to 240 nm as measured using ellipsometry.

110. The coated substrate according to any one of the preceding embodiments, wherein the substrate is a polymer sheet or a glass member, preferably the glass member comprises structured glass such as MM or SM glass.

111. The coated substrate according to any one of the preceding embodiments, wherein the mass ratio of inorganic oxide originating from the elongated dense inorganic oxide particles to total inorganic oxide of the coating is higher in a 20 nm thick top layer of the coating closest to the outer surface of the coated substrate than the average mass ratio of the inorganic oxide originating from dense inorganic oxide particles to total inorganic oxide of the coating,
preferably the mass ratio of inorganic oxide originating from the dense inorganic oxide particles to total inorganic oxide of the coating is at least 50% higher in the top layer of the coating than the average mass ratio of the inorganic oxide originating from elongated dense inorganic oxide particles to total inorganic oxide of the coating,
more preferably the mass ratio of inorganic oxide originating from the elongated dense inorganic oxide particles to total inorganic oxide of the coating is at least twice as high in the top layer the coating than the average mass ratio of the inorganic oxide originating from dense inorganic oxide particles to total inorganic oxide of the coating.

112. The coated substrate according to any one of the preceding embodiments, wherein the substrate demonstrates an improved durability as determined in a PCT—24 hr test as compared with a reference under the same conditions and both using the same substrate.

113. The coated substrate according to any one of the preceding embodiments, wherein the substrate demonstrates an durability as determined in a PCT—48 hr pressure cooker test as compared with a reference under the same conditions and both using the same substrate. Preferably, the coated substrate demonstrates a reduction in transmission as determined in a PCT—48 hr pressure cooker test, as defined herein, of less than 0.25%; preferably less than 0.20%; more preferably less than 0.10%; still more preferably less than 0.05%.

114. The coated substrate according to any one of the preceding embodiments, wherein the reference is substrate coated with only the second layer as defined in any one of the preceding embodiments.

115. The coated substrate according to any one of the preceding embodiments, wherein the substrate demonstrates a ΔE* of less than 2.3 with respect to the gray axis, wherein ΔE* is defined according to CIELAB values, using the CIE76 standard with a D65 illuminant.

116. The coated substrate according to any one of the preceding embodiments, wherein the substrate is a cover glass for a solar module.

117. An article comprising the coated substrate according to any one of the preceding embodiments.

118. A solar module comprising the coated substrate according to any one of the preceding embodiments.

119. Use of the kit according to any one of the preceding embodiments to improve the durability of a coated substrate, preferably a glass substrate.

120. Use of the kit according to any one of the preceding embodiments to improve the durability of a coated cover glass of a solar module.

121. Use of elongated dense inorganic oxide particles with an aspect ratio of at least 2, and a smaller diameter in the range of 3 to 20 nm to increase durability of a coated cover glass of a solar module.

Measurements

Method of Optical Measurement

The transmittance was measured in the wavelengths region from 380 to 1100 nm using an Optosol Transpec VIS-NIR spectrophotometer equipped with an integrating sphere The average transmittance and Max T % (A at Max) were determined. The results are listed below.

Method for Determining Inorganic Oxide Composition

The cured sample is scraped off the substrate with a razorblade. The scrapings are rinsed from the substrate with ethanol and collected. One drop of ethanol suspension is transferred to carbon grid and dried, where after the elemental composition is determined by STEM EDX on scrapings arranged on the edge of the carbon grid. At least components Si, O and Al are measured and amounts may be determined by the software Esprit 1.9.

Method for Determining Size of Pores

Pore size of porogen pores, i.e. pores with a diameter in the range of 10 to 120 nm, is defined as the length of a line indicating the longest distance between walls of the pore on a cross section orthogonal to the surface of the substrate as measured by SEM. For irregular pore, the line indicating the longest distance may go outside pore. As is well known SEM stands for Scanning Electron Microscopy.

For binder pores with a pore size between 1 to 10 nm, ellipsometry is used to measure the pore size, using the method indicated herein. Since the method utilizes sorption of water in the pores, the measured size corresponds to the smallest diameter of the pore.

Method for Determining Size of Particles

The size of the binder particles and the size of the elongated dense inorganic particles are measured using CryoTEM. The average size is the number average size based on ten randomly selected particles.

Ellipsometry

Using ellipsometry the refractive index, layer thickness and the volume fraction and pore size distribution of binder pores are determined. The latter is determined by water sorption under variation of relative partial pressure of water. In a pore size regime ranging from 2 to 50 nm, the saturation pressure (and hence condensation/evaporation of water in the pores) is a function of the smallest dimension of the pore as described by the Kelvin equation. Condensation of water in the pores drastically changes the optical properties of the coating due to the difference in density between water and air, which optical properties are measured by ellipsometry.

Sample preparation depends on substrate type. For float glass, a scotch tape is applied on the backside of the glass to reduce backside reflections. For SM glass, measurement is done using focusing probes to reduce light scattering induced by the sample roughness. No scotch tape is applied at the backside in the case of SM glass. SM glass used is Interfloat GMB SINA 3.2 mm glass.

The ellipsometer to be used is a Woollam M-2000 UI running CompleteEase (Woollam) version 5.20. Typically the refractive index herein is reported at an optical wavelength of 600 nm.

Data Analysis/Method for Modeling

The experimental data are analyzed by fitting to optical models built using CompleteEase. The bare, uncoated substrate is measured first and then fitted using a b-spline model. The coating layers are described by a Cauchy model, using the first two terms of the series development, A and B. From the values, the refractive index as function of wavelength can be calculated using the formula:

$$n(\lambda) = A + \frac{B}{\lambda^2}$$

For the evaluation of the model, the data measured at 35% rH is used. Using an effective medium approximation such as Bruggeman's model, the total amount of porosity (volume fraction of air) in the coating can be calculated. To this end both the measured refractive index of the coating is needed as well as the refractive index of the matrix.

Pressure Cooker (PCT) Test

The Hirayama chamber PC-422R8 Pressure Cooker Test (PCT), also known as an autoclave test, is a highly-accelerated temperature and humidity stress test and uses temperature and humidity as stress factors, the test is derived from JESD22A102 standard from the electronics industry and is commonly adopted by the solar industry.

The purpose of the PCT is to accelerate moisture penetration into the coated and/or uncoated glass by raising the water vapor pressure inside the test chamber to a level that is drastically higher than the water vapor pressure inside the testing specimen and then to evaluate the resistance of coated/uncoated glass to humidity and high pressure environments. The standard test conditions are obtained by placing a test specimen in a climate chamber set at a temperature of 121° C.±2° C. at a relative humidity of 100% RH±5% RH resulting in an absolute pressure of ±2 bar for 24 hours (unless otherwise mentioned). Prior to performing the test samples were thoroughly cleaned with demineralized water and dried for 10 minutes in an oven set at 100° C. and cooled by conditioned for 30 minutes in a climatized room (relative humidity 20%-40 rH % and temperature range of 23° C.±2° C.) prior to start of the test. The PCT was carried out as described above under the standard conditions. After the PCT test the samples were subsequently cleaned with demineralized water and dried for 10 minutes in an oven set at 100° C. and cooled by conditioning for 30 minutes in a climatized room (relative humidity 20%-40 rH % and temperature range of 23° C.±2° C.) prior to optical measurements. The PCT test performance was expressed by a change in average transmission in the wavelength range of 380-1100 nm using a Optosol Transpec-II UV/Vis spectrophotometer (or equivalent). The PCT performance was expressed as a transmission difference by subtracting the transmission average in the range of 380-1100 nm from the transmission average of the sample prior to the PCT test.

EXAMPLES

Example 1: Preparation of Core-Shell Particle Solution

Core-shell particles were prepared by the same method as disclosed in WO2009/030703 using isopropanol instead of ethanol. The solution was further diluted with isopropanol to a concentration of 10.0 wt-% silica equivalents and had a particle size of 135 nm.

Example 2: Preparation of Inorganic Binder

Silica based inorganic binder was prepared from tetraethoxysilane was prepared by the same method as disclosed in WO 2011/157820 and further diluted with isopropanol to achieve a binder solution of about 2 wt-% silica equivalents and a particle size of 3-5 nm.

Example 3: Preparation of Stock Solutions

Al-Stock solution was prepared by dissolving Al(NO$_3$)$_3$.9H2O (Fluka, 06275 Lot SZBG0830V) into a mixture of isopropanol (Brenntag, batch I/103/3jul 15/133333, ref 2427801) and methoxypropanol (Merck, Lot K49958738 820) to a solid content of 5%. Thereafter the solution was further diluted with isopropanol to 2 wt-% alumina equivalents.

Stock solution of elongated IPA-ST-UP particles was prepared by diluting IPA-ST-UP (Nissan Chemical, Lot 111002) with isopropanol to a concentration of 2 wt-% of oxide equivalents. This stock solution was used to prepare the samples in Table 1.

Example 4: Preparation of Coating Formulations for Bottom Layer

All formulations were made in a 1000 ml semi-transparent HDPE bottle with lid. Amounts of each component are indicated in Table 1. Core-shell solution weighted and 2-propanol was added and the bottle shaken. To this mixture, the inorganic binder was added and the bottle shaken. Subsequently the diluted Al-stock solution was added.

Example 5: Preparation of Coating Formulations for Top Layer

All formulations were made in a 1000 ml semi-transparent HDPE bottle with lid. Amounts of each component are indicated in Table 1. Core-shell solution weighted and 2-propanol was added and the bottle shaken. To this mixture, the inorganic binder was added and the bottle shaken. Subsequently the diluted Al-stock solution was added, and finally the stock solution of elongated particles was added.

Example 6: Coating of Samples

The coating formulations used to make the coated samples were maximum 48 hours old. A rectangular shaped container, with an inner size of 2*16*21 cm$^3$, was filled with approximately 400 g of coating formulation.

Glass plates were dipped into the coating formulation to apply the coating formulation on both sides of the glass. The glass used was 3.2 mm float glass (Pilkington Optiwhite S) which was cut into 10*20 cm plates. The plates were washed and dried prior to coating application. Dipping conditions were: 18.5-19.5° C.; relative humidity <40% RH; dipping speed was varied between 2.5-3.5 mm/s as indicated in Table 1.

First, the bottom coating was applied as described in Table 2. Then the sample was dried for at least 10 minutes at room temperature (circa 20° C.; relative humidity <40% RH).

Afterwards, the sample was dried additionally for 5 minutes at 100° C. by placing them in an oven (VWR Venti-line).

After that, the top coating was applied as described in Table 2. Then the sample was dried for at least 10 minutes at room temperature (circa 20° C.; relative humidity <40% RH). Thereafter, the samples were cured as indicated in example 7.

Example 7: Conversion of Applied Coating Formulation into a Functional Coating

The coated samples as obtained in example 6 were cured by heating in an oven at 650° C. for 3.5 minutes (Nabertherm). This treatment is like the thermal conversion realized during the tempering process typically used for cover glass for PV solar modules.

The results of the optical measurements are listed in Table 2.

TABEL 1

| Formulation | Core-shell solution (g) | Iso-propanol (g) | Silica based binder (g) | Elongated particles solution (g) | Al-stock solution (Al(NO3)3) (g) | organic porogen material* (wt %) | Elongated particles** (wt %) | Al2O3*** (wt %) | Dip-speed Float glass (mm/s) |
|---|---|---|---|---|---|---|---|---|---|
| 1.00 | 40 | 238 | 213 | 137 | 89 | 22.5 | 25 | 14 | 3.5 |
| 2.00 | 40 | 249 | 161 | 120 | 78 | 25.0 | 25 | 14 | 3.5 |
| 3.00 | 40 | 258 | 114 | 105 | 69 | 27.5 | 25 | 14 | 3.5 |
| 4.00 | 13 | 15 | 338 | 0 | 98 | 8.0 | 0 | 14 | 2.7 |

*wt % organic pororogen material:

$$\text{wt \% organic porogen material} = \frac{\text{weight [organic porogen material]}}{\text{weight [organic porogen material]} + \text{weight [total amount of inorganics]}} * 100$$

*

**wt % elongated particles is calculated using:

$$\text{Concentration elongated particles wt \%} = \frac{\text{weight SiO}_{2\ elongated\ particles}}{\text{weight SiO}_{2\ binder} + \text{weight SiO}_{2\ core\ shell\ solution} + \text{weight SiO}_{2\ elongated\ particles}} * 100$$

**wt % Al2O3 is calculated using:

$$\text{Al}_2\text{O}_3 \text{ wt \%} = \frac{\text{weight Al}_2\text{O}_3}{\text{weight Al}_2\text{O}_3 + \text{weight SiO}_2} * 100$$

TABLE 2

| Coating formulation Bottom coating (single coating layer on substrate)) | Top coating (second coating layer) | Average T % (380-1100 nm) % | ARE * % (380-1100 nm) | WL@Tmax nm | RI @600 nm Bottom coating | RI @ 600 nm Top coating | PCT 24 h* Δ T % (380-1100 nm) | PCT 48 h* Δ T % (380-1100 nm) |
|---|---|---|---|---|---|---|---|---|
| 1 | None | 96.76 | 5.41 | 565 | 1.30 | None | 0.29 | 0.56 |
| 2 | None | 96.88 | 5.53 | 595 | 1.31 | None | 0.15 | 0.29 |
| 3 | None | 96.95 | 5.60 | 575 | 1.29 | None | 0.27 | 0.42 |
| 4 | None | 94.36 | 3.01 | 530 | 1.44 | None | 0.17 | 0.32 |
| 4 | 1 | 96.53 | 5.18 | 852 | 1.43 | 1.32 | 0.01 | −0.01 |
| 4 | 2 | 96.81 | 5.46 | 858 | 1.43 | 1.31 | −0.10 | −0.05 |
| 4 | 3 | 96.97 | 5.62 | 810 | 1.43 | 1.30 | −0.02 | 0.04 |

In the ARE calculation an average transmission of 380-1100 nm of 91.35 was used for of uncoated float glass.
*Positive values of ΔT % indicate a loss of transmission as a result of the test performed FIG. 1 shows the change in transmission after PCT 48 h of a single layer (coating 1) compared to change in transmission after PCT 48 h of a double layer (coating 4 + coating 1).

The invention claimed is:

1. A kit of parts for providing an antireflective coating having an improved property on a cover glass for use in a solar module, comprising
    (a) A first container comprising a first coating formulation comprising an inorganic oxide binder and a solvent; and
    (b) A second container comprising a second coating formulation comprising
        i. at least 2 wt-% based on inorganic oxide equivalents of elongated dense inorganic oxide particles with an aspect ratio of at least 2 and a smaller diameter in the range of 3 to 20 nm;
        ii. a porogen capable of forming pores with a diameter in the range of 10 to 120 nm, wherein the porogen comprises core-shell nanoparticles wherein the core comprises an organic compound which organic compound comprises a polymer, and the shell comprises an inorganic oxide;
        iii. an inorganic oxide binder; and
        iv. a solvent,
            wherein the second coating formulation comprises 0 to 30 wt-% aluminium oxide equivalents of aluminium containing compound, based on total ash rest after combustion at 600° C., 2 min in air.

2. The kit according to claim 1, wherein the second coating formulation comprises 0.1 to 25 wt-% aluminium oxide equivalents of aluminium containing compound.

3. The kit according to claim 1, wherein the first coating formulation comprises the porogen capable of forming pores with a diameter in the range of 1 to 120 nm and wherein the porogen comprises an amount of organic porogen material, expressed as a wt % organic porogen material, in the range from 1 to 30 wt %.

4. The kit according to claim 1, wherein the second coating formulation comprises the porogen capable of forming pores with a diameter in the range of 10 to 120 nm and wherein the porogen comprises an amount of organic porogen material, expressed as a wt % organic porogen material, in the range from 20 to 50 wt %.

5. The kit according to claim 1, wherein wt % organic porogen material in the first coating formulation is less than the wt % organic porogen material in the second coating formulation.

6. The kit according to claim 1, wherein the porogen has an average size of 20-150 nm as measured using DLS.

7. A method of preparing a coated substrate using the kit according to claim 1 comprising the steps of:

providing a substrate having a first surface;
applying the first coating formulation on the first surface of the substrate;
drying the applied first coating formulation to obtain the substrate comprising an at least partially covered first surface;
applying a the second coating formulation on the at least partially covered first surface;
optionally drying of the applied second coating formulation; and
converting the substrate into a coated substrate.

8. Use of the kit as defined in claim 1 to improve the durability of an AR coated substrate, preferably an AR coated glass substrate.

9. A coated substrate, comprising a substrate, and an anti-reflective coating provided on a surface of the substrate, wherein the anti-reflective coating comprises a first coating layer provided on the surface of the substrate, a second coating layer contacting a surface of the first layer at a side opposite to the substrate, wherein the first layer comprises:
    an inorganic oxide binder; and
    wherein the second layer comprises:
    elongated dense inorganic oxide particles with an aspect ratio of at least 2 and a smaller diameter in the range of 3 to 20 nm;
    0 to 30 wt-% aluminium oxide equivalents of aluminium containing compound;
    an inorganic oxide binder; and
    pores with a diameter in the range of 10 to 120 nm as measured using ellipsometry and/or electron microscopy, formed by a porogen comprising core-shell nanoparticles wherein the core comprises an organic compound which organic compound comprises a polymer, and the shell comprises an inorganic oxide.

10. The coated substrate according to claim 9, wherein the first layer comprises pores with a diameter in the range of 10 to 120 nm as measured using ellipsometry and/or electron microscopy.

11. The coated substrate according to claim 9, wherein the first layer has a lower porosity than the second layer.

12. The coated substrate according to claim 9, wherein the second coating layer comprises between 0.5 to 25 wt-% aluminium oxide equivalents of aluminium containing compound.

13. The coated substrate according to claim 9, wherein the substrate is a glass substrate having a refractive index n0;

the first layer has a first layer thickness in the range from 50 to 180 nm, as measured using ellipsometry, and a refractive index n1 at an optical wavelength of 600 nm in the range of 1.50-1.30 as measured using ellipsometry an a coated substrate;

the second layer has a second layer thickness in the range from 50 to 180 nm, as measured using ellipsometry, and a refractive index n2 at an optical wavelength of 600 nm in the range of 1.35-1.20 as measured using ellipsometry an a coated substrate;

and n0<n1<n2.

14. The coated substrate according to claim 9, wherein the substrate demonstrates a reduction in transmission of less than 0.25% as determined in a PCT-48 hr pressure cooker test.

15. An article comprising the coated substrate according to claim 9.

16. A solar module comprising the coated substrate according to claim 9.

* * * * *